(12) United States Patent
Ishiguro et al.

(10) Patent No.: US 8,476,642 B2
(45) Date of Patent: Jul. 2, 2013

(54) COMPOUND SEMICONDUCTOR DEVICE AND MANUFACTURING METHOD THEREOF

(75) Inventors: Tetsuro Ishiguro, Kawasaki (JP); Atsushi Yamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 84 days.

(21) Appl. No.: 13/289,314

(22) Filed: Nov. 4, 2011

(65) Prior Publication Data

US 2012/0138955 A1    Jun. 7, 2012

(30) Foreign Application Priority Data

Dec. 2, 2010 (JP) ................................. 2010-269663

(51) Int. Cl.
*H01L 31/0312* (2006.01)
*H01L 21/36* (2006.01)
*H01L 21/04* (2006.01)

(52) U.S. Cl.
USPC .................. 257/77; 257/E21.09; 257/E29.09; 257/E29.082; 438/478

(58) Field of Classification Search
USPC ... 257/77, E21.09, E29.09, E29.082; 438/478
See application file for complete search history.

(56) References Cited

U.S. PATENT DOCUMENTS

| | | | |
|---|---|---|---|
| 7,569,870 B2 | 8/2009 | Yanagihara et al. | |
| 7,573,078 B2 * | 8/2009 | Wu et al. | 257/194 |
| 7,638,818 B2 * | 12/2009 | Wu et al. | 257/192 |
| 7,928,475 B2 * | 4/2011 | Parikh et al. | 257/194 |
| 2011/0140118 A1 * | 6/2011 | Ramdani | 257/66 |

FOREIGN PATENT DOCUMENTS

| | | |
|---|---|---|
| JP | 2007-258406 A | 10/2007 |
| WO | WO-2004/066393 | 8/2004 |

* cited by examiner

*Primary Examiner* — David S Blum
(74) *Attorney, Agent, or Firm* — Fujitsu Patent Center

(57) ABSTRACT

A compound semiconductor device includes a substrate; an initial layer formed over the substrate; and a core layer which is formed over the initial layer and contains a Group III-V compound semiconductor. The initial layer is a layer of Group III atoms of the Group III-V compound semiconductor contained in the core layer.

18 Claims, 8 Drawing Sheets

US 8,476,642 B2

COMPOUND SEMICONDUCTOR DEVICE AND MANUFACTURING METHOD THEREOF

CROSS-REFERENCE TO RELATED APPLICATIONS

This application is based upon and claims the benefit of priority of the prior Japanese Patent Application No. 2010-269663,filed on Dec. 2, 2010, the entire contents of which are incorporated herein by reference.

FIELD

Embodiments of the present disclosure relate to a compound semiconductor device and a manufacturing method thereof.

BACKGROUND

Compound semiconductor devices have been developed in which a GaN layer and an AlGaN layer are formed over a substrate and the GaN layer is used as an electron transport layer. One such compound semiconductor device includes GaN-based high electron mobility transistors (HEMTs).

GaN has superior electrical characteristics. For instance, since GaN has a high saturation electron velocity and a wide band gap, it has a high breakdown voltage characteristic. GaN also has a wurtzite crystalline structure and a polarity in a <0001> direction parallel to the c axis. Furthermore, with the heterostructure of the GaN layer and the AlGaN layer, piezoelectric polarization is induced in the AlGaN layer due to the lattice distortion of both layers, generating two-dimensional electron gas (2DEG) of high concentration at an interface between the GaN layer and the AlGaN. Due to the above-described reasons, GaN has been given attention as a material of high-frequency devices and a device for electric power.

In manufacturing the GaN-based HEMT, compound semiconductor layers such as a GaN layer, an AlGaN layer and an AlN layer are formed by a metal-organic vapor phase epitaxy (MOVPE) method. However, lattice constants are different between compound semiconductor layers of different materials and also between a compound semiconductor layer and a substrate, so that distortion increases as the compound semiconductor layer becomes thicker and thus cracks are likely to form in the compound semiconductor layer. Accordingly, it is difficult to form a compound semiconductor layer of an appropriate thickness so as to provide desirable characteristics.

In consideration of these problems, there is a known structure in which a buffer layer is provided between a substrate and an electron transport layer. For instance, there is a structure in which the Al contents of AlGaN constituting a buffer layer are continuously added from the bottom. In such a structure, distortion is reduced due to the buffer layer.

However, even in the conventional GaN-based HEMT including the buffer layer mentioned above, cracks are often found in a compound semiconductor layer.

Related techniques are disclosed in International Publication No. WO 2004/066393 and Japanese Unexamined Patent Application Publication No. 2007-258406.

SUMMARY

According to an aspect of the invention, a compound semiconductor device includes a substrate; an initial layer formed over the substrate; and a core layer which is formed over the initial layer and contains a Group III-V compound semiconductor. The initial layer is a layer of Group III atoms of the Group III-V compound semiconductor contained in the core layer.

According to another aspect of the invention, a compound semiconductor device includes a substrate; a nucleation layer formed over the substrate; a buffer layer formed over the nucleation layer; an electron transport layer formed over the buffer layer; and an electron supply layer formed over the electron transport layer. At least one of the nucleation layer and the electron transport layer includes an initial layer and a core layer which is formed over the initial layer and contains a Group III-V compound semiconductor. The initial layer is a layer of Group III atoms of the Group III-V compound semiconductor contained in the core layer.

According to another aspect of the invention, a method of manufacturing a compound semiconductor device includes forming an initial layer over a substrate, and forming a core layer containing a Group III-V compound semiconductor over the initial layer. The initial layer is a layer of Group III atoms of the Group III-V compound semiconductor contained in the core layer.

According to another aspect of the invention, a method of manufacturing a compound semiconductor device includes forming a nucleation layer over a substrate; forming a buffer layer over the nucleation layer; forming an electron transport layer over the buffer layer; and forming an electron supply layer over the electron transport layer. At least one of the nucleation layer and the electron transport layer includes an initial layer and a core layer which is formed over the initial layer and contains a Group III-V compound semiconductor. The initial layer is a layer of Group III atoms of the Group III-V compound semiconductor contained in the core layer.

The object and advantages of the invention will be realized and attained by at least those elements, features, and combinations particularly pointed out in the claims.

It is to be understood that both the foregoing general description and the following detailed description are exemplary and explanatory and are not restrictive of the invention, as claimed.

DESCRIPTION OF EMBODIMENTS

The present inventors found the following facts through their extensive research on why cracks are formed in a compound semiconductor layer in compound semiconductor devices including various buffer layers. More specifically, cracks are formed by distortion due to a difference in lattice constants between a substrate and a nucleation layer and also between a buffer layer and an electron transport layer.

Embodiments will be described in detail below by referring to the attached drawings.

Figure 1A:
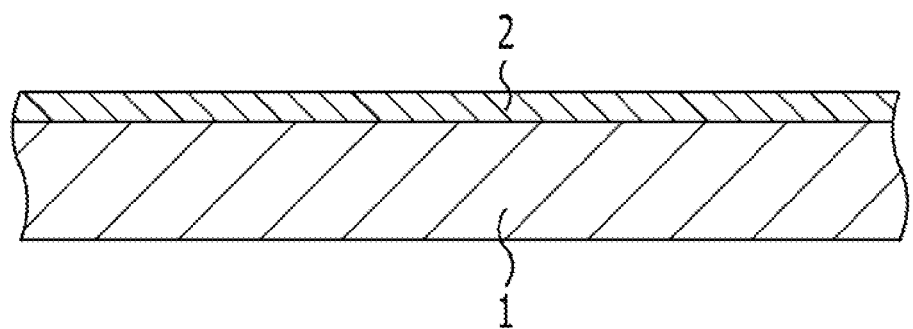
FIGS. 1A and 1B are sectional views illustrating a method of manufacturing a compound semiconductor device in accordance with a first embodiment.
Figure 1B:
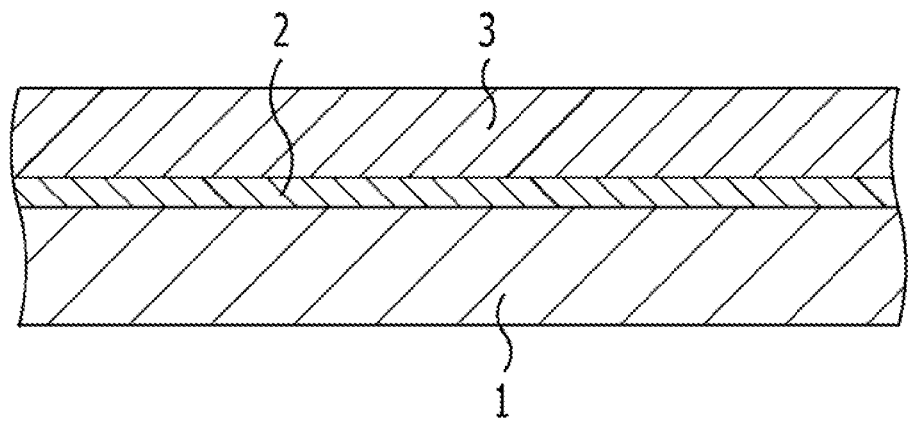

The first embodiment is described below. FIGS. 1A and 1B are sectional views illustrating a method of manufacturing a compound semiconductor device in accordance with the first embodiment.

In the first embodiment, an initial layer 2 is formed over a substrate 1 as illustrated in FIG. 1A. For the substrate 1, for example, a Si substrate, a SiC substrate, a sapphire substrate, a GaN substrate, or the like may be used. Also, various compound semiconductor layers may be formed over the substrate described above. After the initial layer 2 is formed, a core layer 3 is formed over the initial layer 2. The core layer 3 contains a Group III-V compound semiconductor such as AlN, GaN or AlGaN. The initial layer 2 is a layer of Group III atoms of the Group III-V compound semiconductor contained in the core layer 3, such as an Al layer or a Ga layer, for example.

Thus, in the first embodiment, a Group III atom layer is formed as the initial layer 2 before the formation of the core 3 containing the Group III-V compound semiconductor. Since the Group III atom layer has higher ductility than the Group III-V compound semiconductor layer, distortion, which is caused by a difference in lattice constants between the substrate 1 and the core layer 3, is mitigated by the initial layer 2. Thus, the core layer 3 may be unlikely to have cracks. Such a combination of the initial layer 2 and the core layer 3 is used for a nucleation layer and/or an electron transport layer (channel layer), so that the likelihood of cracks may be reduced and/or cracks may be prevented.

Additionally, the Group III atom layer may be less likely to generate pits than the Group III-V compound semiconductor while the layers are being formed. This is because the migration of group III atoms is restrained by Group V atoms in forming the Group III-V compound semiconductor layer, while Group III atoms may be likely to migrate with no such restraint in forming the Group III atom layer. Therefore, in this embodiment, the initial layer 2 may be unlikely to have pits and also tends to be flatter. The core layer 3 formed over the initial layer 2 thus becomes flatter. When the Group III atom layer is applied to HEMT, electron mobility can be higher.

Figure 2A:
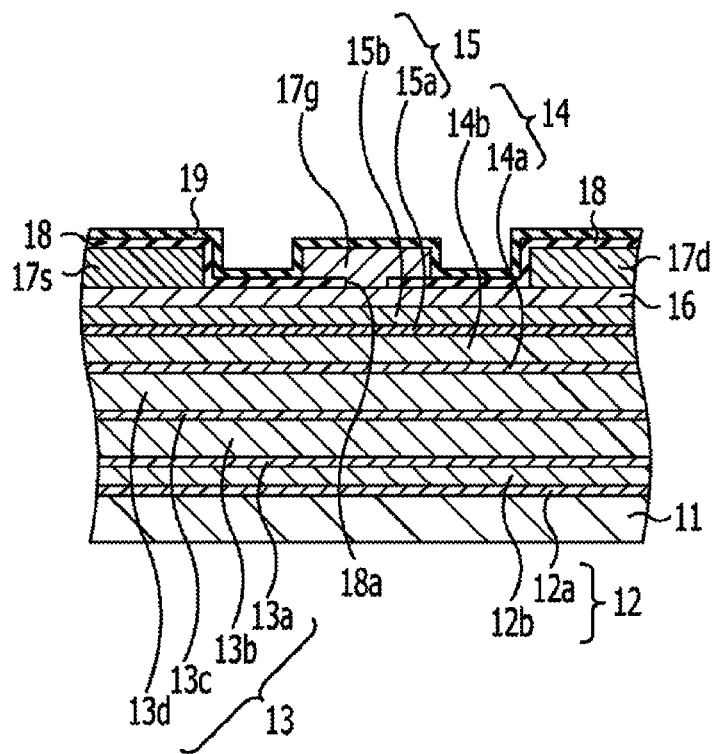
FIGS. 2A and 2B are diagrams illustrating the structure of a GaN-based HEMT in accordance with a second embodiment.
Figure 2B:
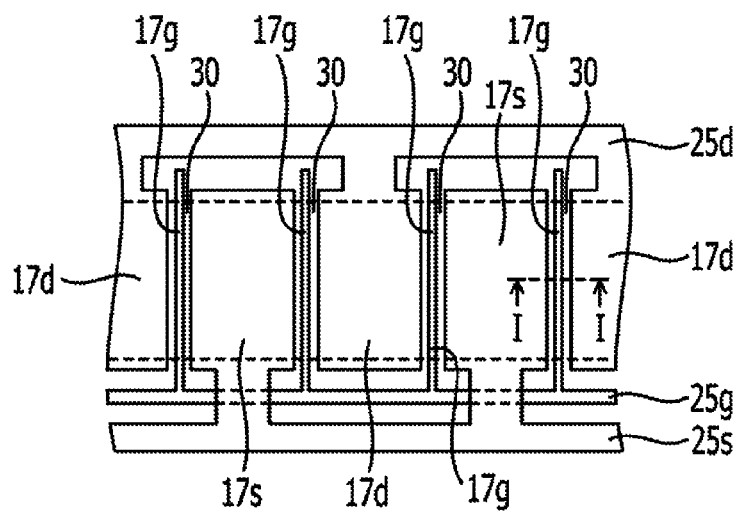

The second embodiment is described below. FIGS. 2A and 2B are diagrams illustrating the structure of a GaN-based HEMT (compound semiconductor device) in accordance with the second embodiment.

In the second embodiment, a nucleation layer 12, a buffer layer 13, an electron transport layer 14, an electron supply layer 15 and a cap layer 16 are formed over a substrate 11 as illustrated in FIG. 2A. The substrate 11 is, for instance, a Si substrate, a SiC substrate or a sapphire substrate. It is particularly preferable to use a material of high resistance so as to reduce the likelihood of and/or prevent current leakage to the substrate 11.

The nucleation layer 12 includes an initial layer 12a and a core layer 12b. For instance, the initial layer 12a is an Al layer while the core layer 12b is an AlN layer. For example, the initial layer 12a has a thickness of about 2 nm to 3 nm, and the core layer 12b has a thickness of about 100 nm to 500 nm (e.g., 300 nm).

For the buffer layer 13, an initial layer 13a, a core layer 13b, an initial layer 13c and a core layer 13d may be formed. For instance, the initial layer 13a is an $Al_{0.7}Ga_{0.3}$ layer, and the core layer 13b is an $Al_{0.7}Ga_{0.3}N$ layer. For example, the initial layer 13a has a thickness of about 2 nm to 3 nm while the core layer 13b has a thickness of about 200 nm to 1,000 nm. Moreover, the initial layer 13c is, for example, an $Al_{0.3}Ga_{0.7}$ layer while the core layer 13d is an $Al_{0.3}Ga_{0.7}N$ layer. For example, the initial layer 13c has a thickness of about 2 nm to 3 nm while the core layer 13d has a thickness of about 200 nm to 1,000 nm.

The electron transport layer 14 may include an initial layer 14a and a core layer 14b. For example, the initial layer 14a is a Ga layer while the core layer 14b is a non-doped i-GaN layer. The initial layer 14a has a thickness of, e.g., about 2 nm to 3 nm, and the core layer 14b has a thickness of, e.g., about 500 nm to 2,000 nm (e.g., 1,000 nm).

The electron supply layer 15 may include a non-doped i-AlGaN layer 15a and an n-type AlGaN layer 15b. For example, the i-AlGaN layer 15a has a thickness of about 1 nm to 30 nm (e.g., 5 nm) while the n-AlGaN layer 15b has a thickness of about 3 nm to 30 nm (e.g., 15 nm). The Al content of the i-AlGaN layer 15a and of the n-AlGaN layer 15b is preferably 0.3 or below, so that a decrease in crystallizability due to a lattice mismatch is reduced and/or prevented. For instance, Si is doped to the n-AlGaN layer 15b at about $1\times10^{18}$ $cm^{-3}$ to $1\times10^{20}$ $cm^{-3}$ (e.g., $5\times10^{18}$ $cm^{-3}$).

The cap layer 16 may include an n-type GaN layer. The cap layer 16 has a thickness of, e.g., 2 nm to 20 nm (e.g., 10 nm). For instance, Si is doped to the cap layer 16 at about $1\times10^{18}$ $cm^{-3}$ to $1\times10^{20}$ $cm^{-3}$ (e.g., $5\times10^{18}$ $cm^{-3}$).

Over the cap layer 16, source electrodes 17s and drain electrodes 17d may be formed. For example, the source electrodes 17s and the drain electrodes 17d are in ohmic contact with the cap layer 16. The source electrodes 17s and the drain electrodes 17d may include a Ti film and an Al film formed over the Ti film. Over the cap layer, a passivation film 18 is formed so as to cover the source electrodes 17s and the drain electrodes 17d. For example, a silicon nitride film is formed as the passivation film 18. Openings 18a for gate electrodes are formed in the passivation film 18 between the source electrodes 17s and the drain electrodes 17d. For example, gate electrodes 17g which are in Schottky contact with the cap layer 16 through the openings 18a, are formed over the passivation film 18. The gate electrodes 17g include, for example, a Ni film and an Au film formed over the Ni film. Over the passivation film 18, a passivation film 19 is formed so as to cover the gate electrodes 17g. As the passivation film 19, for example, a silicon nitride film is formed. Openings are formed in the passivation films 18 and 19 for connection to external terminals or the like.

The layout of the substrate 11 seen from the surface is as illustrated in, for example, FIG. 2B. The shapes in plan view of the gate electrodes 17g, the source electrodes 17s and the drain electrodes 17d are in a comb-like form. The source electrodes 17s and the drain electrodes 17d are arranged alternately. More specifically, a plurality of gate electrodes 17g is commonly connected with a gate wiring 25g; a plurality of source electrodes 17s is commonly connected with a source wiring 25s; and a plurality of drain electrodes 17d is commonly connected with a drain wiring 25d. The gate electrodes 17g are arranged between the source electrodes 17s and the drain electrodes 17d. The output is generally increased by adopting such a multifinger gate structure. The sectional view illustrated in FIG. 2A is a cross section taken along line I-I of FIG. 2B. An active region 30 includes the nucleation layer 12, the buffer layer 13, and the electron transport layer 14. A region surrounding the active region 30 is made inactive by ion implantation, mesa etching, or the like.

Thus, in the second embodiment, the initial layer 12a is formed below the core layer 12b of the nucleation layer 12.

The initial layer 14a is formed below the core layer 14b of the electron transport layer 14. The initial layer 12a has higher ductility than the core layer 12b while the initial layer 14a has higher ductility than the core layer 14b. Accordingly, even if there is a difference in lattice constant between the substrate 11 and the core layer 12b, distortion due to the difference is reduced by the initial layer 12a. Similarly, even if there is a difference in lattice constant between the buffer layer 13 and the core layer 14b, distortion due to the difference is reduced by the initial layer 14a. Thus, cracks are unlikely to form in the core layers 12b and 14b. Additionally, the initial layer 13a is formed below the core layer 13b of the buffer layer 13, and the initial layer 13c is formed below the core layer 13d of the buffer layer 13. The initial layer 13a has higher ductility than the core layer 13b while the initial layer 13c has higher ductility than the core layer 13d. Thus, cracks are unlikely to form in the core layers 13b and 13d.

A method of manufacturing the compound semiconductor device in accordance with the second embodiment is described below. FIGS. 3A to 3E are sectional views, illustrating the method of manufacturing the compound semiconductor device in accordance with the second embodiment.

Figure 3A:
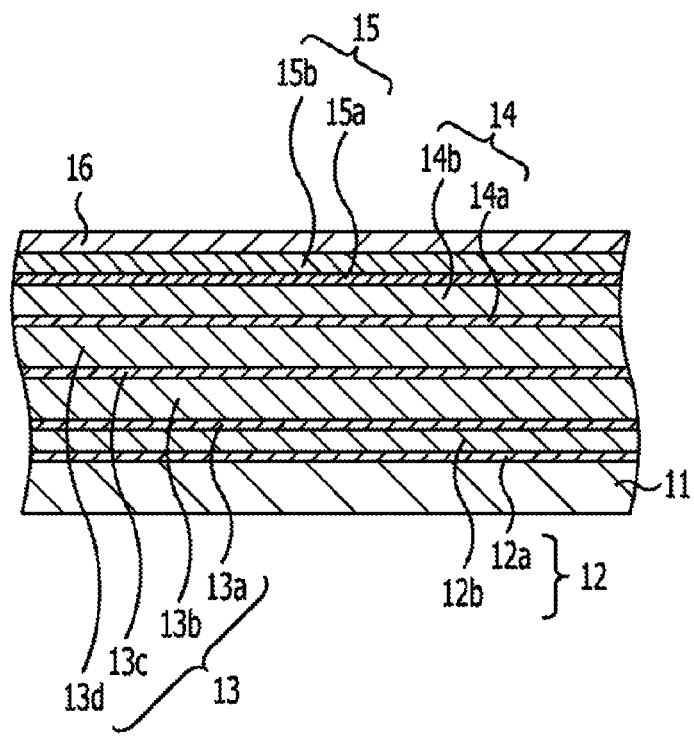
FIGS. 3A to 3E are sectional views illustrating a method of manufacturing the GaN-based HEMT in accordance with the second embodiment.

As illustrated in FIG. 3A, a nucleation layer 12, a buffer layer 13, an electron transport layer 14, an electron supply layer 15, and a cap layer 16 are formed over a substrate 11. The nucleation layer 12, the buffer layer 13, the electron transport layer 14, the electron supply layer 15, and the cap layer 16 are formed by a crystal growth method such as an MOVPE method. These layers can be continuously formed by using a selected source gas. As the source of aluminum (Al) and gallium (Ga), for example, trimethylaluminum (TMA) and trimethylgallium (TMG) may be used respectively. As the source of nitrogen (N), for example, ammonia ($NH_3$) may be used. As the source of silicon (Si) as an n-type impurity, for example, silane ($SiH_4$) may be used.

In forming the nucleation layer 12, TMA is supplied to a reactor for several seconds without supplying $NH_3$, and an Al layer is grown to about 2 nm to 3 nm as the initial layer 12a, for example. $NH_3$ is then supplied so as to grow an AlN layer to about 100 nm to 500 nm as the core layer 12b, for example. The initial layer 12a contains more Group III atoms than the core layer 12b.

In forming the buffer layer 13, TMA and TMG are supplied to the reactor for several seconds without supplying $NH_3$, and an $Al_{0.3}Ga_{0.7}$ layer is grown to about 2 nm to 3 nm as the initial layer 13a, for example. $NH_3$ is then supplied so as to grow an $Al_{0.3}Ga_{0.7}N$ layer to about 200 nm to 1,000 nm as the core layer 13b, for example. Subsequently, the supply of $NH_3$ is stopped; the flow of TMA is increased; and the flow of TMG is reduced, thus growing the $Al_{0.7}Ga_{0.3}$ layer to about 2 nm to 3 nm as the initial layer 13c, for example. Subsequently, the supply of $NH_3$ is restarted, thereby growing the $Al_{0.7}Ga_{0.3}N$ layer to about 200 nm to 1,000 nm as the core layer 13d, for example. The initial layer 13a contains more Group III atoms than the core layer 13b, and the initial layer 13c contains more Group III atoms than the core layer 13d. Moreover, the core layer (AlGaN layer) of the buffer layer 13 is not limited to two layers, but may be one layer, or three or more layers. The Al content may vary in each core layer.

In forming the electron transport layer 14, for example, TMG is supplied to the reactor for several seconds without supplying $NH_3$, and a Ga layer is grown to about 2 nm to 3 nm as the initial layer 14a. $NH_3$ is then supplied so as to grow a GaN layer to about 500 nm to 2,000 nm as the core layer 14b, for example. The initial layer 14a contains more Group III atoms than the core layer 14b.

Figure 3B:
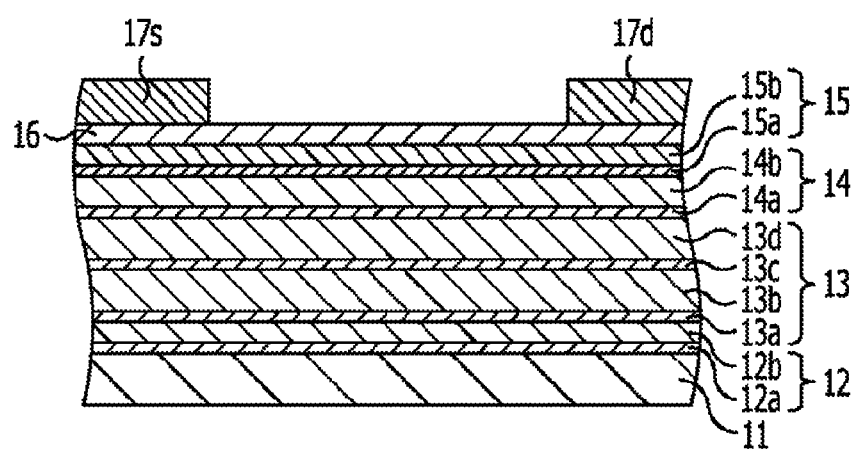

After the cap layer 16 is formed, source electrodes 17s and drain electrodes 17d are formed over the cap layer 16 as illustrated in FIG. 3B by, e.g., a lift-off technique. In forming the source electrodes 17s and the drain electrodes 17d, a resist pattern with openings for the source electrodes 17s and the drain electrodes 17d is formed, and Ti and Al are deposited. Then, Ti and Al over the resist pattern are removed along with the resist pattern, and are treated with heat at 400° C. to 1,000° C. (for example, 600° C.) in a nitrogen atmosphere to establish ohmic contact.

Figure 3C:
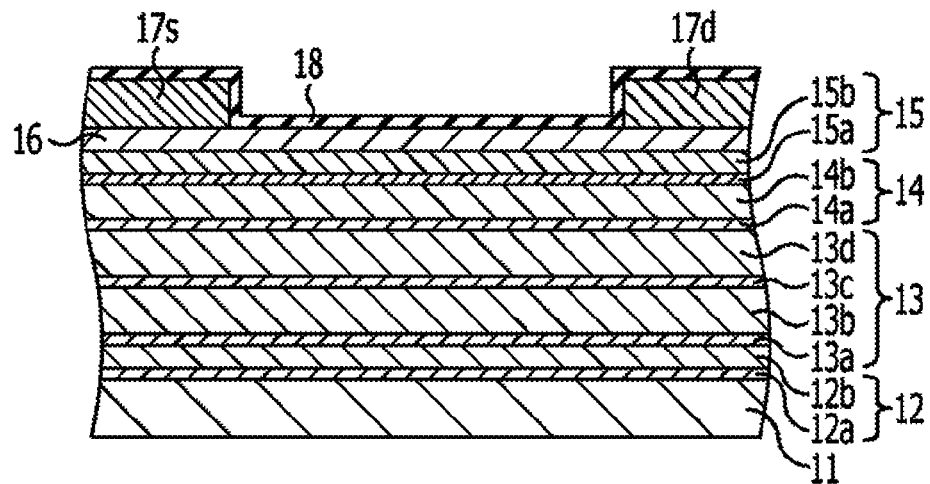

As illustrated in FIG. 3C, a passivation film 18 is formed over the cap layer 16 so as to cover the source electrodes 17s and the drain electrodes 17d. As the passivation film 18, a silicon nitride film is formed by, e.g., a plasma chemical vapor deposition (CVD) method.

Figure 3D:
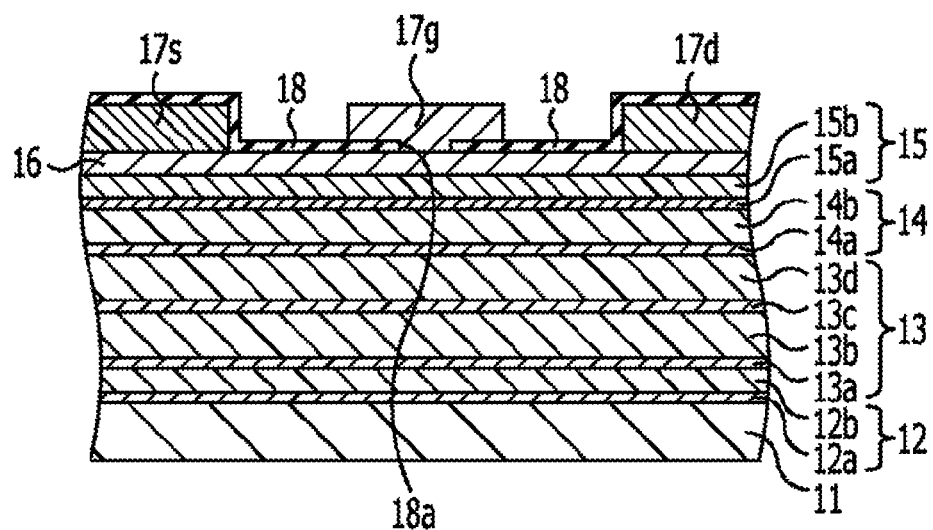

Subsequently, a resist pattern is formed with openings at predetermined locations for openings 18a. Then, etching is carried out based on the resist pattern, and the openings 18a are formed in the passivation film 18 as illustrated in FIG. 3D. Then, gate electrodes 17g which are in contact with the cap layer 16 are formed through the openings 18a over the passivation film 18 by the lift-off technique. In forming the gate electrodes 17g, the resist pattern used for forming the openings 18a is removed. Then, a new resist pattern is formed so as to provide openings for the gate electrodes 17g, and Ni and Au are deposited. Subsequently, Ni and Au over the resist pattern are removed along with the resist pattern.

Figure 3E:
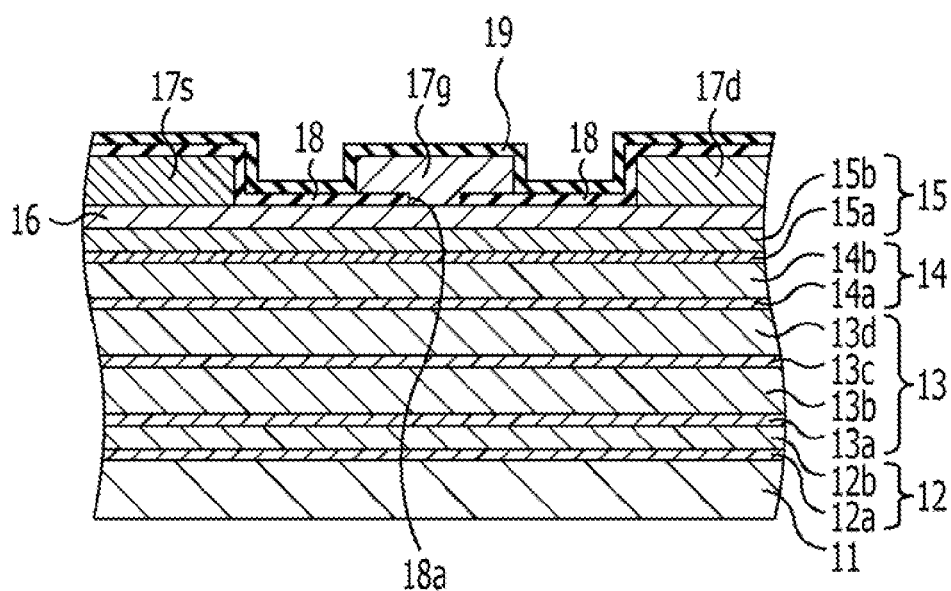

Then, as illustrated in FIG. 3E, a passivation film 19 is formed over the passivation film 18 so as to cover the gate electrodes 17g. For the passivation film 19, for example, a silicon nitride film is formed by the plasma CVD method.

Furthermore, the gate wiring 25g is formed so as to commonly connect a plurality of gate electrodes 17g; the source wiring 25s is formed so as to commonly connect a plurality of source electrodes 17s; and the drain wiring 25d is formed so as to commonly connect a plurality of drain electrodes 17d (see FIG. 2B). As a result, a GaN-based HEMT illustrated in FIGS. 2A and 2B can be obtained.

In this method, an Al layer is formed as the initial layer 12a and an AlN layer is then formed as the core layer 12b in forming the nucleation layer 12, for example. Accordingly, the initial layer 12a with few pits may be formed, thus minimizing pits at the core layer 12b formed thereover and also providing the core layer 12b that is substantially flat. Similarly, a Ga layer is formed as the initial layer 14a and a GaN layer is formed thereover as the core layer 14b in forming the electron transport layer 14. Accordingly, the initial layer 14a with few pits may be formed, thus reducing and/or minimizing pits in the core layer 14b formed thereover and also providing the core layer 14b so as to be substantially flat. Hence, higher electron mobility becomes achievable. In forming the buffer layer 13, an $Al_{0.3}Ga_{0.7}$ layer is formed as the initial layer 13a, and an $Al_{0.3}Ga_{0.7}N$ layer is formed thereover as the core layer 13b. Additionally, an $Al_{0.7}Ga_{0.3}$ layer is formed as the initial layer 13c, and an $Al_{0.7}Ga_{0.3}N$ layer is formed thereon as the core layer 13d. As a result, the initial layers 13a and 13c with few pits may be formed, thus providing substantially flat core layers 13b and 13d.

Figure 4:
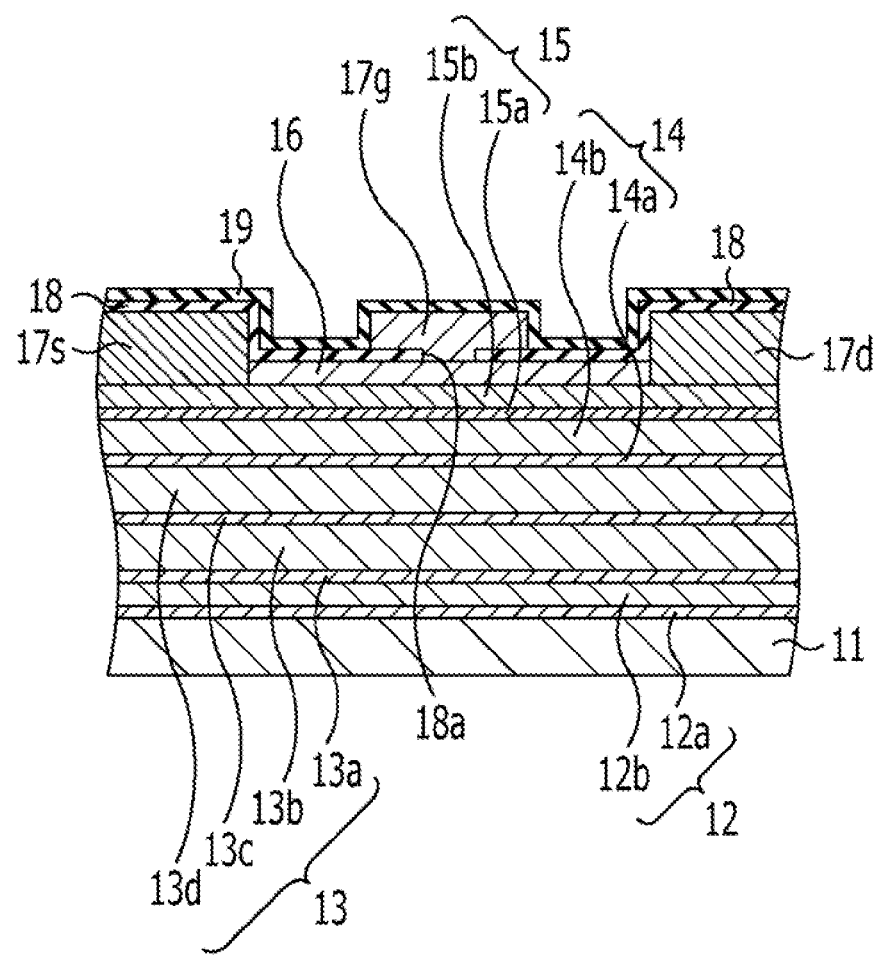
FIG. 4 is a sectional view illustrating a modification of the second embodiment.

Furthermore, as illustrated in FIG. 4, by providing openings for the source electrodes 17s and the drain electrodes 17d in the cap layer 16, the source electrodes 17s and the drain electrodes 17d may be formed in contact with the n-AlGaN layer 15b. In this case, a portion of the cap layer 16 may be left in the openings, and a portion of the n-AlGaN layer 15b may be removed.

Moreover, a resistor, a capacitor and the like may be mounted over the substrate 11, thus providing a monolithic microwave integrated circuit (MMIC).

Figure 5:
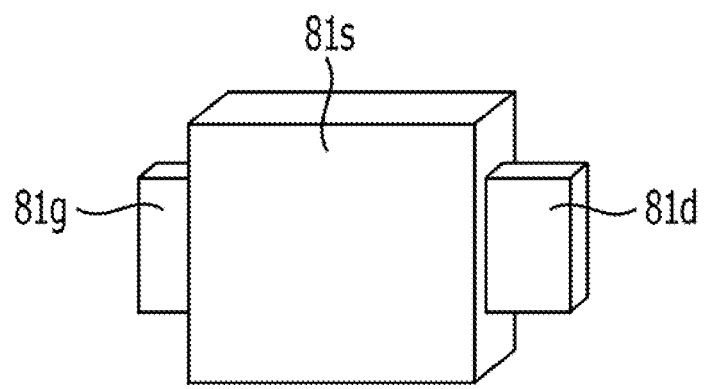
FIG. 5 is a diagram illustrating the exterior of a high power amplifier.

The GaN-based HEMTs of these embodiments can be used as, for example, a high power amplifier. FIG. 5 illustrates the exterior of a high power amplifier. In this example, a source terminal 81s connected to the source electrode is provided at the surface of a package. A gate terminal 81g connected to the gate electrode and also a drain terminal 81d connected to the drain electrode extend from the sides of the package.

Figure 6A:
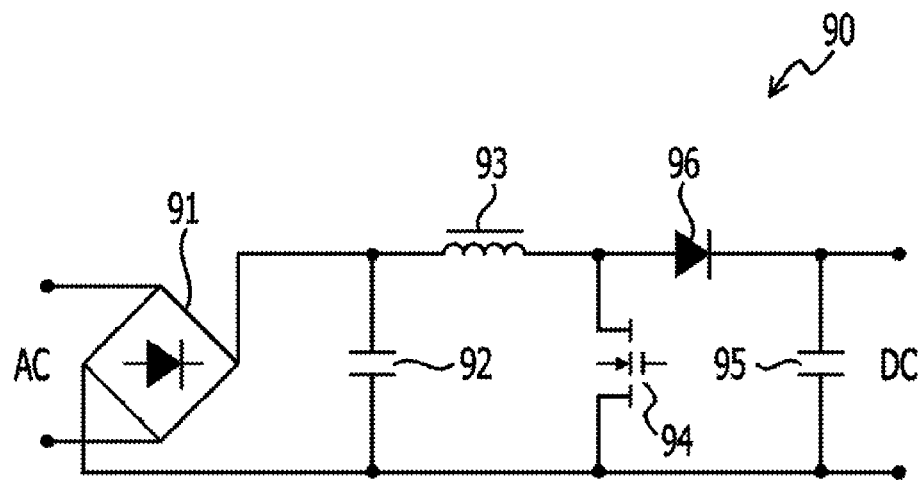
FIG. 6A illustrates a power factor correction (PFC) circuit.

The GaN-based HEMTs of the embodiments can be used as, for example, a power source device. FIG. 6A illustrates a power factor correction (PFC) circuit, and FIG. 6B illustrates a server power source (power source device) containing the PFC circuit illustrated in FIG. 6A.

As illustrated in FIG. 6A, the PFC circuit 90 includes a capacitor 92 connected to a diode bridge 91 to which an alternating current (AC) power source is connected. One terminal of a choke coil 93 is connected to one terminal of the capacitor 92; and one terminal of a switching element 94 and an anode of the diode 96 are connected to another terminal of the choke coil 93. The switching element 94 is equivalent to the HEMT in the embodiments described above while the one terminal is equivalent to the drain electrode of the HEMT. Additionally, another terminal of the switching element 94 is equivalent to the source electrode of the HEMT. To a cathode of a diode 96, one terminal of the capacitor 95 is connected. Another terminal of the capacitor 92, the other terminal of the switching element 94 and another terminal of a capacitor 95 are grounded. A direct current (DC) power source is drawn out between both terminals of the capacitor 95.

Figure 6B:
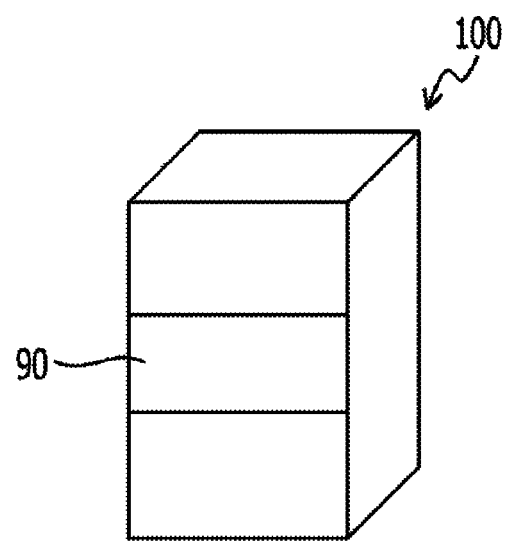
FIG. 6B illustrates a power source device.

As illustrated in FIG. 6B, the PFC circuit 90 is built into a server power source 100 or the like.

Similar to the server power source 100, a power source device that is operable at higher speed can also be constructed. The same switching element as the switching element 94 may be used for a switching power source or an electronic apparatus. Furthermore, the semiconductor device can be used as a part for a full-bridge power circuit such as the power circuit of a server, for example.

In the embodiments, a silicon carbide (SiC) substrate, a sapphire substrate, a silicon substrate, a GaN substrate, a GaAs substrate, or the like may be used as the substrate. The substrate may be conductive, semi-insulating or insulating.

Moreover, the structures of the gate electrodes, source electrodes and drain electrodes are not limited to those in the above-described embodiments. For instance, the electrodes may have a single layer structure. Furthermore, the method of forming these electrodes is not limited to the lift-off method. As long as ohmic characteristics are obtained, the heat treatment after the formation of the source electrodes and the drain electrodes may be omitted. Additionally, the heat treatment may be carried out on the gate electrodes.

Also, the thicknesses, materials, and the like of each layers are not limited to those in the embodiments described above. For example, a Ga layer or an AlGa layer may be formed as the initial layer of the nucleation layer, and a GaN layer or an AlGaN layer may be formed as the core layer. Moreover, as the initial layer of the electron transport layer, an Al layer or an AlGa layer may be formed; and an AlN layer or an AlGaN layer may be formed as the core layer. Furthermore, as the initial layer of the buffer layer, an Al layer or a Ga layer may be formed; and an AlN layer or a GaN layer may be formed as the core layer.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiments in accordance with aspects of the present invention have been described in detail, it should be understood that various changes, substitutions, and alterations could be made hereto without departing from the spirit and scope of the invention.

What is claimed is:

1. A compound semiconductor device comprising:
    a substrate;
    an initial layer formed over the substrate; and
    a core layer which is formed over the initial layer and contains a Group III-V compound semiconductor;
    wherein the initial layer is a layer of Group III atoms of the Group III-V compound semiconductor contained in the core layer.

2. The compound semiconductor device according to claim 1, wherein the initial layer and the core layer form a nucleation layer.

3. The compound semiconductor device according to claim 2, wherein the initial layer is an Al layer and the core layer is an AlN layer.

4. The compound semiconductor device according to claim 1, wherein the initial layer and the core layer form an electron transport layer.

5. The compound semiconductor device according to claim 4, wherein the initial layer is a Ga layer and the core layer is a GaN layer.

6. A compound semiconductor device comprising:
    a substrate;
    a nucleation layer formed over the substrate;
    a buffer layer formed over the nucleation layer;
    an electron transport layer formed over the buffer layer; and
    an electron supply layer formed over the electron transport layer;
    wherein at least one of the nucleation layer and the electron transport layer includes an initial layer and a core layer which is formed over the initial layer and contains a Group III-V compound semiconductor; and
    wherein the initial layer is a layer of Group III atoms of the Group III-V compound semiconductor contained in the core layer.

7. The compound semiconductor device according to claim 6, wherein the initial layer is an Al layer, a Ga layer or an AlGa layer, and the core layer is an AlN layer, a GaN layer or an AlGaN layer.

8. The compound semiconductor device according to claim 6, wherein the buffer layer includes a second initial layer and a second core layer which is formed over the second initial layer and contains a Group III-V compound semiconductor; and wherein the second initial layer is a layer of Group III atoms of the Group III-V compound semiconductor contained in the second core layer.

9. The compound semiconductor device according to claim 6, wherein the substrate is a Si substrate, a SiC substrate or a sapphire substrate.

10. A method of manufacturing a compound semiconductor device comprising:
    forming an initial layer over a substrate; and
    forming a core layer containing a Group III-V compound semiconductor over the initial layer;
    wherein the initial layer is a layer of Group III atoms of the Group III-V compound semiconductor contained in the core layer.

11. The method of forming a compound semiconductor device according to claim 10, wherein the initial layer and the core layer form a nucleation layer.

12. The method of forming a compound semiconductor device according to claim 11, wherein the initial layer is an Al layer and the core layer is an AlN layer.

13. The method of forming a compound semiconductor device according to claim 10, wherein the initial layer and the core layer form an electron transport layer.

14. The method of forming a compound semiconductor device according to claim 13, wherein the initial layer is a Ga layer and the core layer is a GaN layer.

15. A method of manufacturing a compound semiconductor device comprising:
  forming a nucleation layer over a substrate;
  forming a buffer layer over the nucleation layer;
  forming an electron transport layer over the buffer layer; and
  forming an electron supply layer over the electron transport layer;
  wherein at least one of the nucleation layer and the electron transport layer includes an initial layer and a core layer which is formed over the initial layer and contains a Group III-V compound semiconductor; and
  wherein the initial layer is a layer of Group III atoms of the Group III-V compound semiconductor contained in the core layer.

16. The method of manufacturing a compound semiconductor device according to claim 15, wherein the initial layer is an Al layer, a Ga layer or an AlGa layer, and the core layer is an AlN layer, a GaN layer or an AlGaN layer.

17. The method of manufacturing a compound semiconductor device according to claim 15, wherein the buffer layer includes a second initial layer and a second core layer which is formed over the second initial layer and contains a Group III-V compound semiconductor; and wherein the second initial layer is a layer of Group III atoms of the Group III-V compound semiconductor contained in the second core layer.

18. The method of manufacturing a compound semiconductor device according to claim 15, wherein the substrate is a Si substrate, a SiC substrate or a sapphire substrate.

* * * * *